US007898357B2

(12) United States Patent
Phuyal et al.

(10) Patent No.: US 7,898,357 B2
(45) Date of Patent: Mar. 1, 2011

(54) COAXIAL IMPEDANCE MATCHING ADAPTER AND METHOD OF MANUFACTURE

(75) Inventors: Pratibha Chaulagai Phuyal, Darien, IL (US); Kendrick Van Swearingen, Woodridge, IL (US); Albert Cox, Orland Park, IL (US); Jeffrey D. Paynter, Momence, IL (US)

(73) Assignee: Andrew LLC, Hickory, NC (US)

(*) Notice: Subject to any disclaimer, the term of this patent is extended or adjusted under 35 U.S.C. 154(b) by 213 days.

(21) Appl. No.: 12/423,970

(22) Filed: Apr. 15, 2009

(65) Prior Publication Data

US 2009/0278622 A1 Nov. 12, 2009

Related U.S. Application Data

(60) Provisional application No. 61/052,606, filed on May 12, 2008.

(51) Int. Cl.
*H03H 7/38* (2006.01)

(52) U.S. Cl. .......................................... 333/34; 333/161

(58) Field of Classification Search ................... 333/33, 333/34, 35, 81 A, 160, 161, 162, 185
See application file for complete search history.

(56) References Cited

U.S. PATENT DOCUMENTS

| | | | | |
|---|---|---|---|---|
| 2,531,437 | A | 11/1950 | Johnson et al. | |
| 2,533,239 | A | 12/1950 | Gent et al. | |
| 3,209,287 | A | 9/1965 | Oxner et al. | |
| 3,440,573 | A * | 4/1969 | Butler | 333/161 |
| 4,035,748 | A | 7/1977 | Kusaka et al. | |
| 4,283,694 | A | 8/1981 | Pauker | |
| 4,610,032 | A | 9/1986 | Miller et al. | |
| 4,951,012 | A | 8/1990 | Oppelt et al. | |
| 5,233,360 | A | 8/1993 | Kuroda et al. | |
| 5,365,203 | A * | 11/1994 | Nakamura et al. | 333/161 |
| 6,323,743 | B1 | 11/2001 | Zelenz et al. | |
| 6,411,180 | B1 | 6/2002 | Henningsson et al. | |
| 6,636,129 | B2 | 10/2003 | Zennamo, Jr. et al. | |

(Continued)

FOREIGN PATENT DOCUMENTS

| | | |
|---|---|---|
| JP | 09055601 | 2/1997 |

OTHER PUBLICATIONS

European Search Report of counterpart EPO Application No. 09006005.4-1248, issued Aug. 7, 2009.

*Primary Examiner*—Stephen E Jones
(74) *Attorney, Agent, or Firm*—Babcock IP, PLLC

(57) ABSTRACT

An impedance adapter with body and cap portions coupled together encloses a cavity with a printed circuit board (PCB). The PCB is provided with a trace on a first side and a ground plane on a second side. The trace is coupled to a first contact at a first end of the PCB and a second contact at a second end of the PCB. The trace has a sinuous path between the first contact and the second contact, the path longer than a longitudinal axis length of the PCB. The first and second contacts are supported coaxial within the inner conductor bore of the respective cap portion and body portion by first and second end insulators. The ground plane coupled to the body portion and the cap portion. A method of manufacture for the adapter includes steps of pre-assembling the PCB, contacts and insulators before insertion into the cavity.

21 Claims, 9 Drawing Sheets

U.S. PATENT DOCUMENTS

| | | | |
|---|---|---|---|
| 6,639,487 | B1 | 10/2003 | Salmela et al. |
| 6,642,819 | B1 | 11/2003 | Jain et al. |
| 6,791,436 | B2 | 9/2004 | Zennamo, Jr. et al. |
| 6,794,957 | B2 | 9/2004 | Shafer et al. |
| 7,075,385 | B2 | 7/2006 | Haunberger et al. |
| 7,094,104 | B1 | 8/2006 | Burke et al. |
| 7,142,073 | B2 | 11/2006 | Kim et al. |
| 7,255,599 | B1 | 8/2007 | Chawgo et al. |
| 7,278,887 | B1 | 10/2007 | Palinkas et al. |
| 7,323,951 | B2 | 1/2008 | Montena |
| 7,348,865 | B2 | 3/2008 | Carvalho et al. |
| 2005/0162238 | A1 | 7/2005 | Ho |

* cited by examiner

COAXIAL IMPEDANCE MATCHING ADAPTER AND METHOD OF MANUFACTURE

CROSS REFERENCE TO RELATED APPLICATIONS

This application claims the benefit of U.S. Provisional Patent Application No. 61/052,606, "Coaxial Impedance Matching Adapter", by Pratibha Chaulagi Phuyal, Kendrick Van Swearingen, Albert Cox and Jeffrey D. Paynter filed May 12, 2008—currently pending and hereby incorporated by reference in its entirety.

BACKGROUND

RF systems components are generally configured for a standardized characteristic impedance, enabling interconnection of the various systems components with reduced power losses.

Standardized characteristic impedances common in the RF industry include 50, 75, 110 and 300 Ohms. At microwave frequencies, the preferred characteristic impedance is 50 ohms. Therefore, a large number of microwave frequency RF devices such as transceivers, antennas, interconnecting transmission lines and other devices configured for in-line connection are configured for 50 ohm characteristic impedance.

Prior impedance matching adapters have applied a range of different electrical circuitry and/or apparatus to transform characteristic impedance, for example, between 50 and 75 ohms. RLC lumped element impedance transformers, such as wound ferrite toroids, may generate undesirable parasitic effects as operating frequencies increase, for example above 500 Mhz.

Another impedance matching solution is application of a load inline with the transmission line. Impedance transformers of this type may introduce an insertion loss that is unacceptably high.

The dimensions of microstrip transmission lines may be manipulated to form low loss impedance transformers. Multi-section impedance matching transformers such as Chebyshev ¼ wavelength, coaxial, microstrip or stripline transformers apply a series of transmission line width steps, each spaced ¼ wavelength apart along the transmission line. Passage along the transmission line through each step raises or lowers the characteristic impedance depending upon the direction of travel. Depending upon the desired operating frequency(s) and acceptable insertion loss levels, a series of steps separated by ¼ wavelength each, suitable to arrive at the desired characteristic impedance transformation, may require a transmission line of considerable length.

Cost of manufacture, including materials costs and labor, may be a significant factor in commercial success in the impedance adapter market.

Therefore, it is an object of the invention to provide an apparatus that overcomes deficiencies in the prior art.

BRIEF DESCRIPTION OF THE DRAWINGS

The accompanying drawings, which are incorporated in and constitute a part of this specification, illustrate embodiments of the invention and, together with the general and detailed descriptions of the invention appearing herein, serve to explain the principles of the invention.

DETAILED DESCRIPTION

Figure 1:
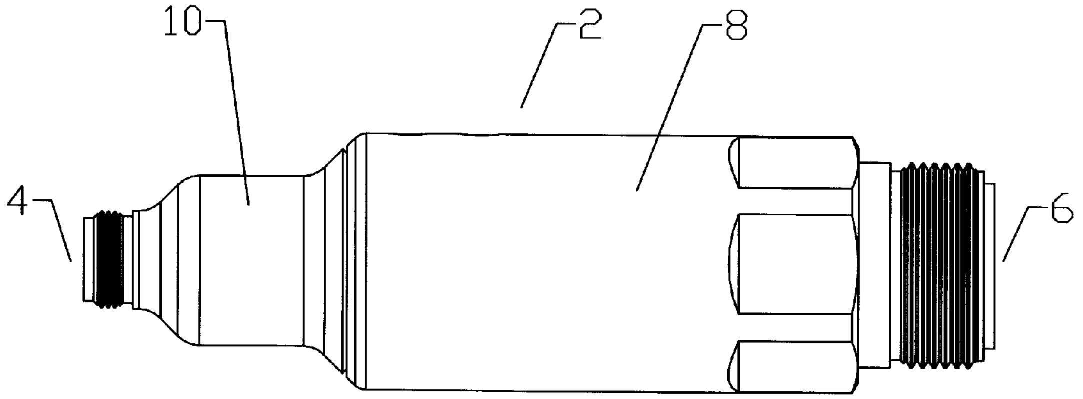
FIG. 1 is a schematic external side view of a first exemplary embodiment of a Coaxial Impedance Matching Adapter.

The inventor(s) have recognized that, due to the larger dimensions of 50 ohm characteristic impedance transmission lines and connectors, 50 ohm characteristic impedance systems have a significantly higher materials, manufacturing, logistics and installation cost than systems having higher characteristic impedances. Further, the inventors have recognized that a cost efficient inline coaxial impedance matching adapter with low insertion loss and signal degradation characteristics would enable use of, for example, 75 ohm characteristic impedance interconnecting transmission lines and connectors within an otherwise 50 ohm characteristic impedance system, thereby achieving a significant cost savings.

A first exemplary embodiment of a Coaxial Impedance Matching Adapter (CIMA) 2 is demonstrated in FIGS. 1-4. The CIMA 2 may be configured for in-line insertion between sections of coaxial transmission line and/or various RF devices such as radios and antennas. The CIMA 2 may be designed for insertion via standardized or proprietary coaxial connector interfaces or via direct interconnection with and/or between two coaxial cable transmission lines. The first exemplary embodiment demonstrates a CIMA 2 configuration for 50 ohm characteristic impedance transmission line at a first end 4 and for a standardized coaxial connector interface commonly used for 75 ohm characteristic impedance transmission lines/equipment at a second end 6.

The first end 4 and the second end 6 are also applied herein as identifiers for respective ends of discrete elements of the CIMA 2, to identify same according to their alignment along a longitudinal axis of the CIMA 2 extending between the first end 4 and the second end 6.

Figure 2:
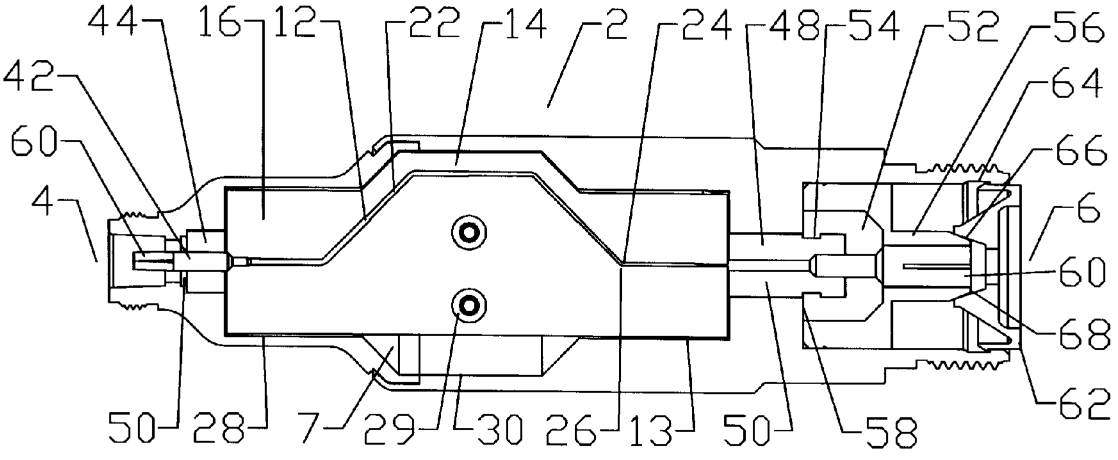
FIG. 2 is a schematic partial cross section view of FIG. 1.
Figure 3:
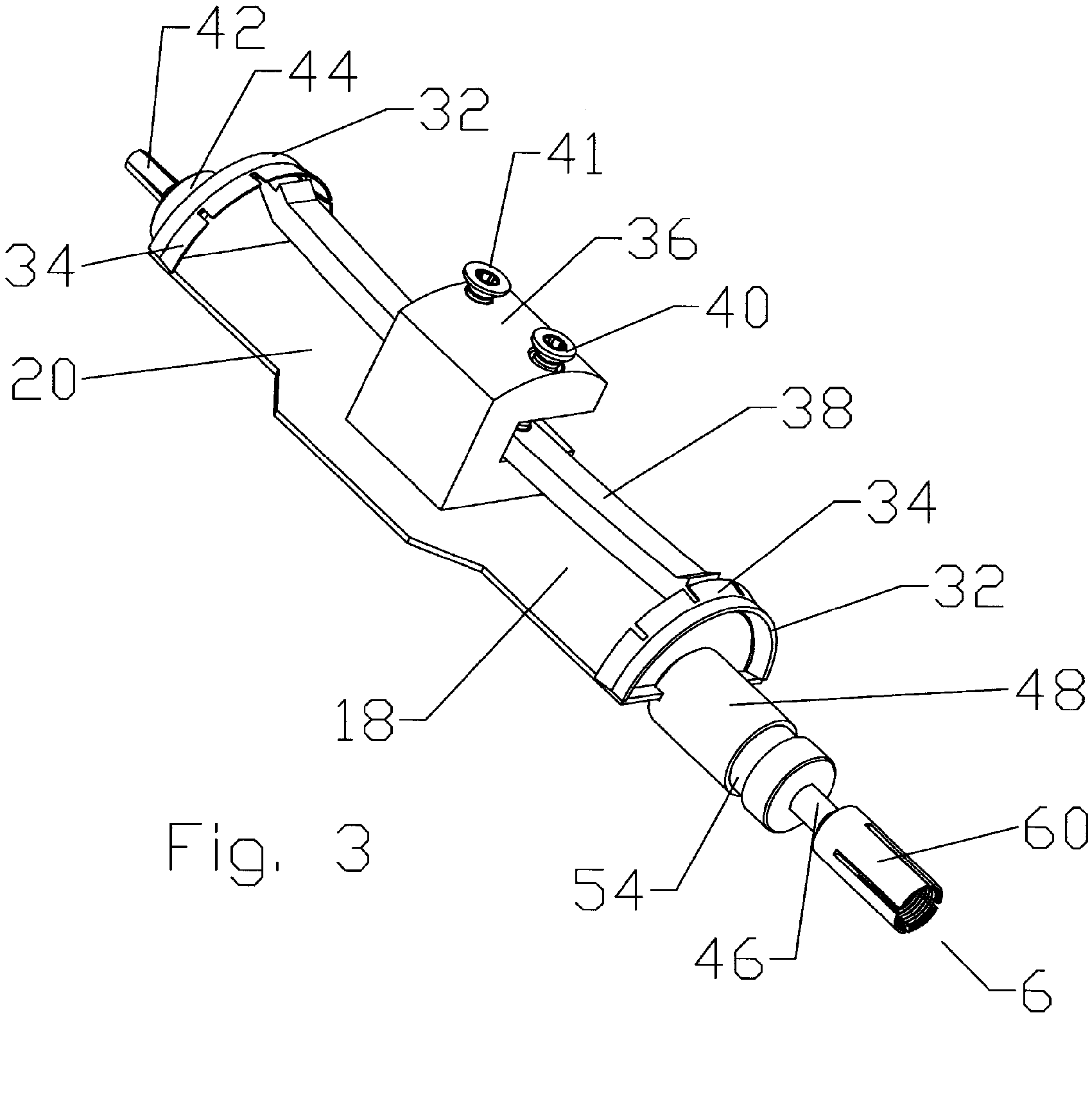
FIG. 3 is a schematic angled isometric view of internal components of the Coaxial Impedance Matching Adapter of FIG. 1, showing the second side, with the enclosure removed for clarity.

A microstrip transmission line is contained within an environmentally sealed cavity 7 formed enclosed by a body portion 8 and a mating cap portion 10. The microstrip transmission line is formed as a trace 12 on a first side 14 of a printed circuit board (PCB) 16 (FIG. 2) having a ground plane 18 on a second side 20 (FIG. 3).

To minimize the overall length requirements for the microstrip transmission line, the PCB 16 substrate material is preferably selected to be a microwave quality substrate having a high and uniform dielectric constant. Suitable PCB 16 substrates include glass filled PTFE substrates available from the Taconic Corporation of Petersburgh, N.Y., USA such as RF-60A, 30 mil (Dk=6.15) or the like.

The microstrip transmission line trace 12 may be derived from a series of Chebyshev ¼ wavelength spaced apart trace 12 width step(s) 22 that reduce the trace 12 width from a wide width at the low impedance end, here the first end 4, to a narrower width at the high impedance end, here the second end 6. The number of steps(s) 22, each separated, for example, by ¼ wavelength of a desired operating frequency of the CIMA 2, is determined by the desired operating bandwidth, with more step(s) 22 increasing the bandwidth characteristics of the CIMA 2. Further tuning of the microstrip parameters may be applied to tune for specific portions of the desired frequency band with respect to specific step(s) 22, bend(s) 24 and/or the placement of nearby ground field sources, such as the cavity sidewall(s) 13 and/or fastener(s) 29. Alternative trace 12 solutions include ¼ wave stub resonator filters aligned in parallel or series configurations, and/or various microstrip bandpass filters. Any trace solution which net transforms the characteristic impedance may be applied, including bandwith tuned microstrip traces.

The inventors have recognized that, because the manufacture of an enclosing metal housing of extended length with a high tolerance bore and suitable strength characteristics may represent a significant portion of the resulting device cost, the overall length of the PCB 16 should be reduced. As best shown in FIG. 2, to reduce the length of the PCB 16, the trace 12 is formed with a bended and/or doubled back sinuous path including a series of sharp and/or arcuate bend(s) 24 that route the trace 1 2 away from and then back to a centerline of the longitudinal axis of the CIMA 2, resulting in the trace 12 having a length greater than a longitudinal axis length of the PCB 16.

Each bend 24 may create an opportunity for signal degradation. To address the potential signal degradation introduced by each bend 24, the bend(s) 24 of the present embodiment are demonstrated with shallow angles, such as 45 degrees, and a miter corner is demonstrated applied to the outer side 26 of each bend 24. To further minimize signal degradation the step(s) 22 may be located at linear portions of the trace 12, such as midpoints of linear trace 12 segments between each of the bend(s) 24.

Figure 5:
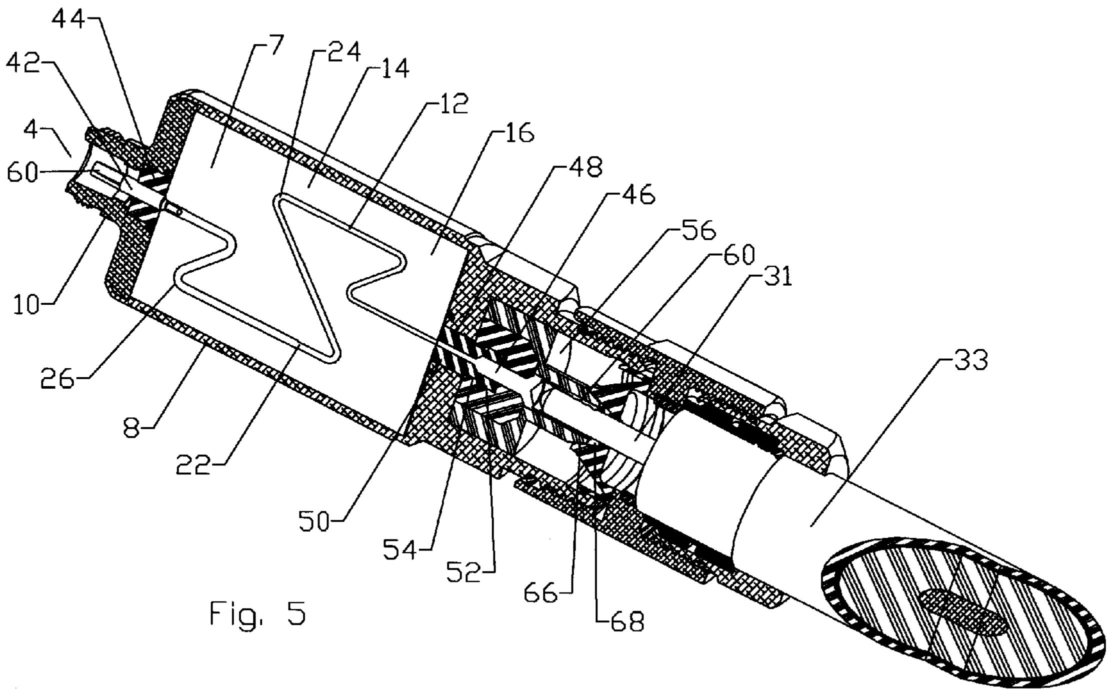
FIG. 5 is a schematic partial cross sectional isometric view of a second exemplary embodiment of a Coaxial Impedance Matching Adapter, shown attached to a coaxial cable.

The body portion 8 and mating cap portion 10 that together form the surrounding enclosure are demonstrated as being formed with a coaxial bore that forms a cavity 7 for the PCB 16 with a first diameter 28 at either end and a larger second diameter 30 in a mid portion. The PCB 16 is dimensioned to seat within the cavity 7, the PCB 16 dimensions matching a cross section of the cavity 7, the trace 12 aligned with the longitudinal axis at the first end 4 and the second end 6 for interconnection with an inner conductor 31 of the respective coaxial transmission line 33 (see FIG. 5) and/or coaxial connector interfaces applied to each of the first and second ends 4,6. In the present embodiment, the connection to the inner conductor(s) 31 is via a first contact 42 surrounded adjacent the PCB 16 by a first end insulator 44 and a second contact 46 surrounded adjacent the PCB 16 by a second end insulator 48. The first and second contact(s) 42, 46 may be coupled to the trace 12 by soldering a preferably less than half diameter section of each thereto, thus maintaining axial alignment of the first side 14 of the PCB 16, and thus the interconnections with the trace 12, to the enclosure.

As best shown in FIG. 3, the ground plane 18 applied to the second side 20 of the PCB 16 may be spaced slightly away from the PCB 16 periphery so that interconnection between the ground plane 18 and the enclosure sidewall(s) 13 is limited to ground contact(s) 32 placed proximate the first end 4 and second end 6 of the PCB 16, respectively. The ground contact(s) 32 extend along the width of the PCB 16 on the second side 20 at each end and extend radially outward to the first diameter 28. At the first diameter 28, a plurality of spring finger(s) 34, oriented to extend toward a center of the cavity, provide a secure electromechanical contact with the enclosure sidewall(s) 13.

Figure 4:
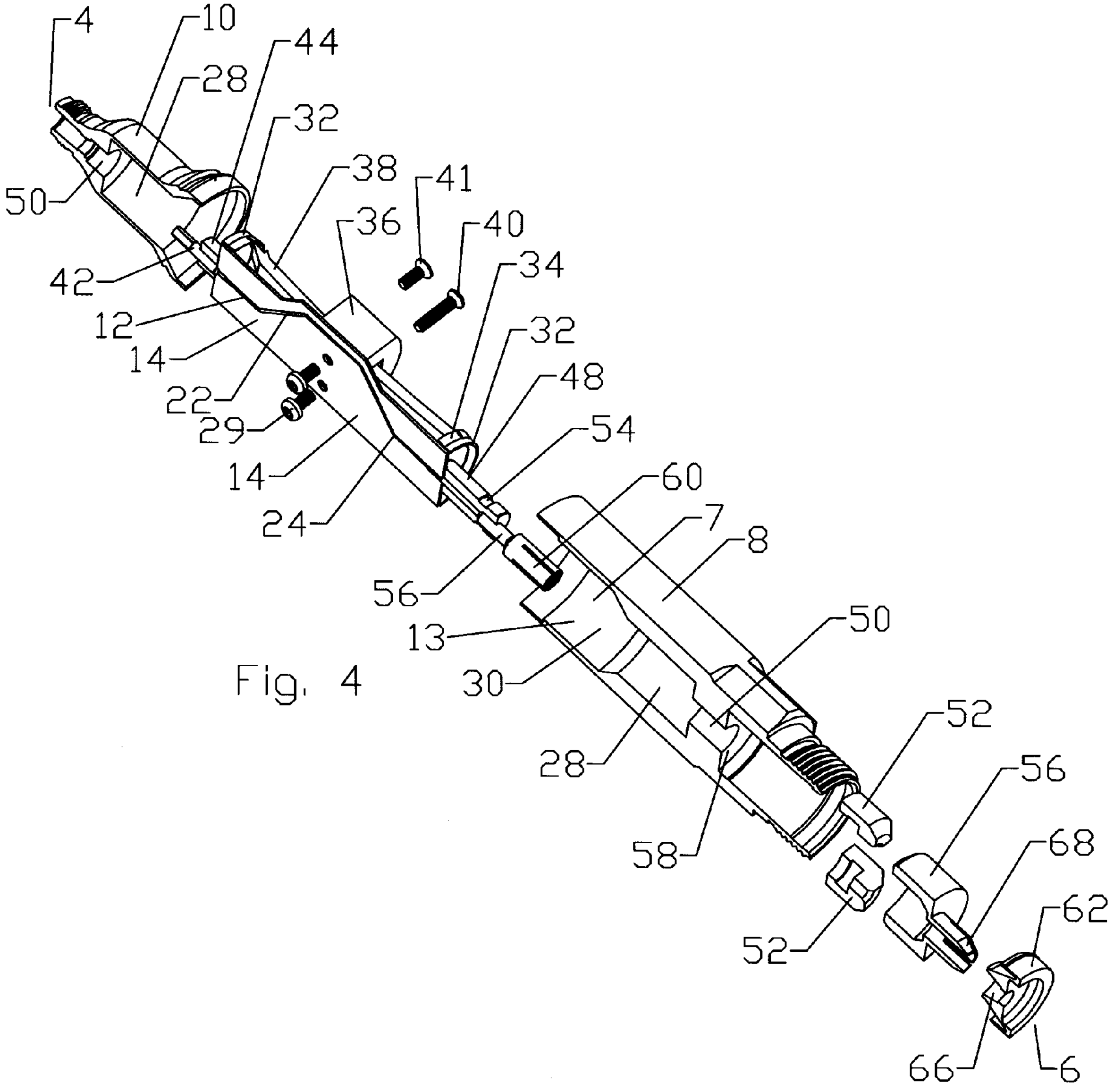
FIG. 4 is a schematic partial cross section exploded isometric view of the Coaxial Impedance Device of FIG. 1.

As demonstrated in FIG. 4, the CIMA 2 may be assembled by preparing a sub-assembly of the PCB 16, ground contact (s) 32, any supporting structure, the first and second contact (s) 42, 46 and respective first and second end insulator(s) 44, 48. Insulator mating surfaces of the first and second contact(s) 42, 46 may be knurled to rotationally interlock them with their respective insulator. The sub-assembly may then be inserted into the bore of the body portion 8, the PCB 16 seating within the first diameter 28 and second diameter 30, the second end 6 ground contact 32 spring finger(s) 34 engaging the first diameter 28, and the second end insulator 48 passing through and seating within an inner conductor bore 50, mating surfaces of which may also be knurled to prevent rotation of the respective first and second end insulator(s) 44, 48 therein.

To further support the PCB 16 and ground contact(s) 32 during CIMA 2 assembly, installation and over extended periods of use, a supporting structure such as a support block 36 may be applied to the second side 20 and/or within the body portion 8. A fastener screw 41 passing through the sidewall 30 may be applied to secure the support block 36 against the second diameter sidewall 30. The support block 36 is configured to receive a tension bar 38 that extends between contact with each of the ground contact(s) 32 proximate the first diameter 28. A tension screw 40, also passing through the sidewall 30 and support block 36, is positioned to retain and bias the tension bar 38 into secure supporting contact with the ground contacts 32 after the PCB 16 with attached ground contacts 32 is inserted into the cavity 7 of the body portion 8.

The sub-assembly may be axially locked within the body portion 8 by an outward projecting shoulder 49 formed in the second insulator 48 (see FIG. 6) and dielectric key(s) 52 that seat in a retaining groove 54 of the second end insulator 48 adjacent a second end 6 shoulder 58 of the inner conductor bore 50. The dielectric key(s) 52 are then retained by a dielectric retainer 56 that fits between the dielectric key(s) 52 and the second end 6 bore sidewall, preventing radial movement of the dielectric key(s) 52 out of engagement with the retaining groove 54.

The PCB 16 is sealed within the cavity 7 by placing the cap portion 10 over the first end 4 of the body portion 8. As the cap portion 10 is seated, the first contact passes through a corresponding inner conductor bore 50 of the cap portion 10 and the first end insulator 44 is seated therein, the first end 4 of the PCB 16 seating within a first diameter 28 of the cap portion 10, and the first end 4 ground contact 32 spring finger(s) 34 engaging the first diameter 28. The cap portion 10 and the body portion 8 engage, for example, with overlapping annular shoulder portions that seat against each other. Once seated, the cap portion 10 and the body portion 8 may be permanently joined together, sealing the PCB 16 there within, for example by a swage operation bending the outer overlapping annular shoulder portion over the inner overlapping shoulder. Alternatively, the body portion 8 and the cap portion 10 may be provided with a threaded interconnection.

Depending upon the desired interconnection interface(s) provided at the first and second ends 4,6, the first and second contacts 42,46 may each be provided with a spring basket 60 for receiving and securely gripping the inner conductor 31 of a mating connector or coaxial cable transmission line 33. A compression member 62 may be provided on one or both of the connection interfaces to improve connection characteristics of the first and or second contact(s) 42,46. The compression member 62 may be retained, for example, by a snap connection into an inner diameter annular compression member groove 64 proximate the respective end of the CIMA 2 along the extent of which the compression member 62 is axially movable. A wedge surface 66 formed on an inner diameter of an aperture of the compression member 62 is dimensioned to mate with a ramp surface 68 formed on distal ends of spring fingers extending from the dielectric retainer 56 over the spring fingers that together form the spring basket 60. As the compression member 62 is shifted axially towards the CIMA 2 during cable or connector connection, the wedge surface 66 engages the ramp surface 68, biasing the ramp surface 68 radially inward and thereby the spring basket 60 radially inward to more securely grip the mating inner conductor 31.

The overall length of the PCB 16 is shortened as a function of the distance the bend(s) 24 allow the trace 12 to be spaced away from the longitudinal axis in a sinuous path, resulting in the trace 12 having a longer length than a longitudinal axis length of the PCB 16. However, spacing the trace 12 away from the longitudinal axis also increases the required diameter of the surrounding enclosure.

A second exemplary embodiment, as shown in FIGS. 5-11, demonstrates an alternative trace 12 layout that includes a sinuous path in which bend(s) 24 are arranged to direct the trace 12 back upon itself and/or across the longitudinal axis to enable a reduction of the CIMA 2 overall length and/or second diameter 30 and thus the size of the surrounding enclosure, potentially with a trade-off with electrical performance. The bends are also demonstrated with a continuous width, i.e. inside and outside edges formed as arc segments with a common radius centerpoint. Further, to minimize the size of the surrounding enclosure, the trace 12 may be spaced away from the enclosure sidewall by, for example, a minimum of at least four times the trace 12 width from each edge.

Figure 6:
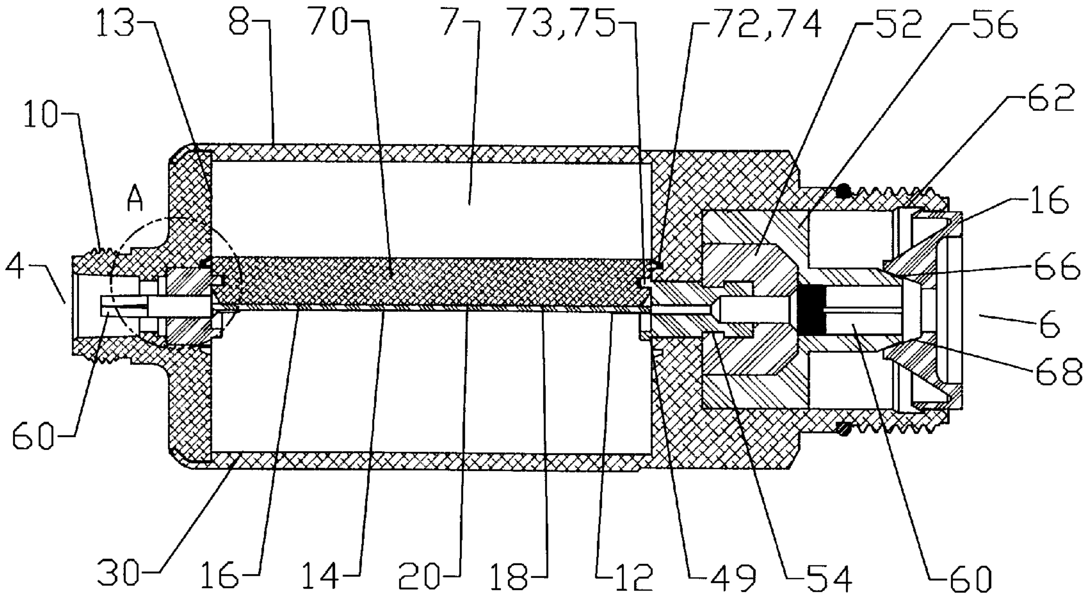
FIG. 6 is a schematic partial cross sectional side view, the cross section normal to a plane of the printed circuit board, of the Coaxial Impedance Matching Adapter of FIG. 5.
Figure 7:
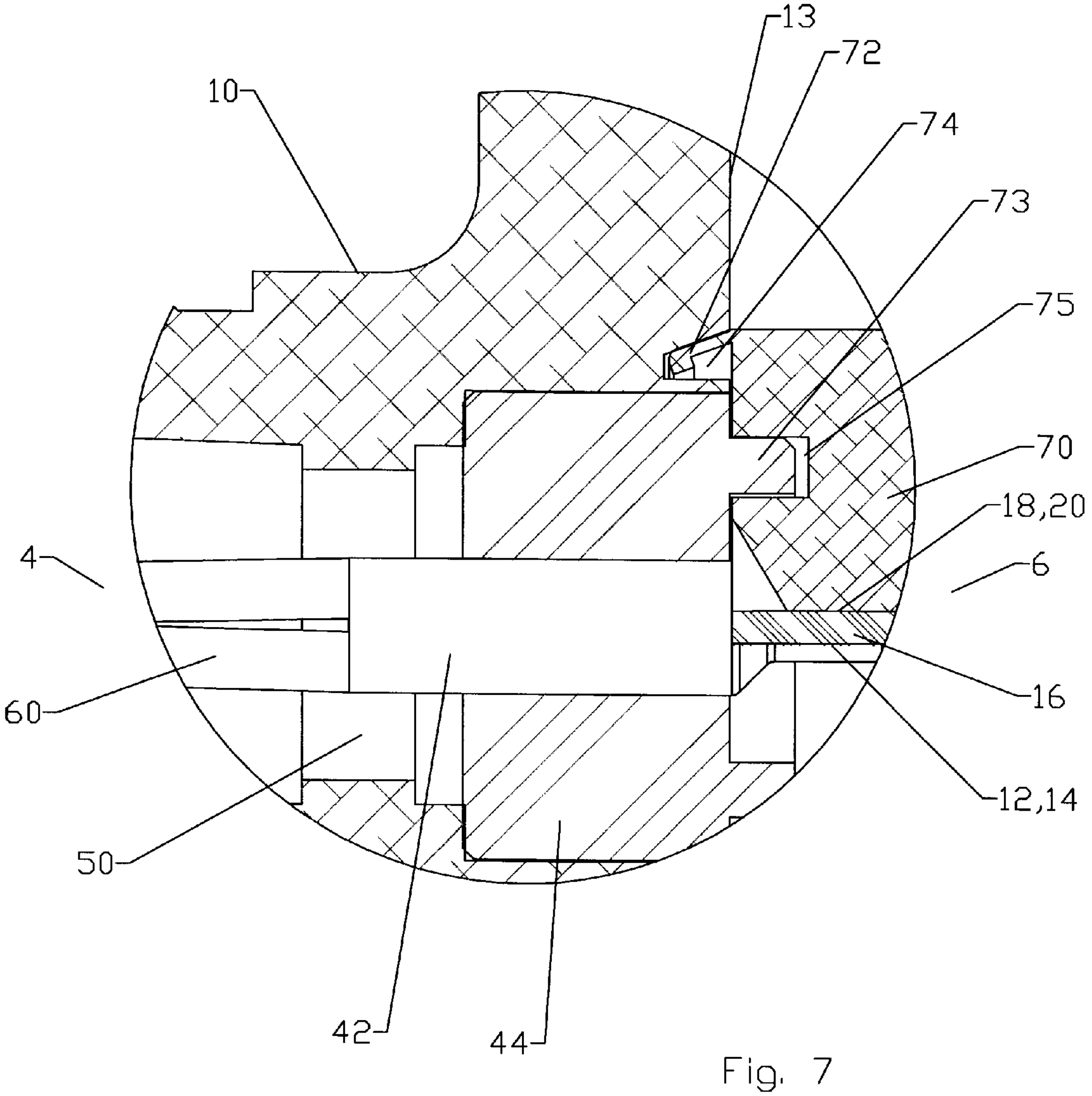
FIG. 7 is a close-up view of area A of FIG. 6.
Figure 8:
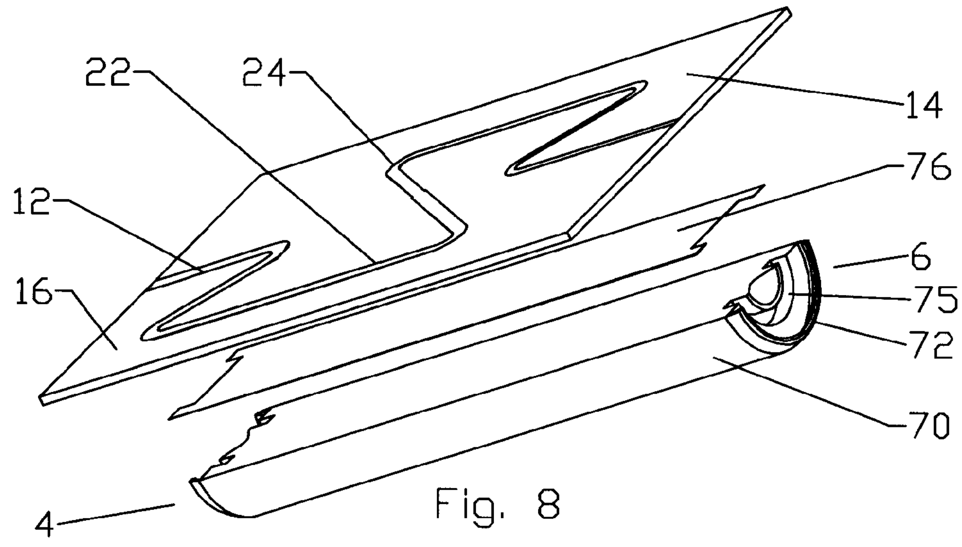
FIG. 8 is an exploded isometric view of the printed circuit board and ground block of FIG. 6.

The PCB 16 is supported in the second exemplary embodiment by a ground block 70 that also provides a secure electrical interconnection between the ground plane 18, the cap portion 10 and the body portion 8. As best shown in FIGS. 6 and 7, first and second ends 4, 6 of the ground block 70 are demonstrated formed with a projecting rim 72 that mates with, for example, a ground groove 74 formed in each of the cap portion 10 second end 6 and the body portion 8 first end, each proximate and coaxial with the inner conductor bore 50. The projecting rim 72 may have a flexure characteristic, the projecting rim 72 formed with a slight, for example outward, misalignment with the ground groove 74, resulting in a bias between the ground groove(s) 74 and the respective projecting rim(s) 72 when assembled, thereby, providing a secure electrical interconnection therebetween. As shown in FIG. 8, the ground block 70 may be coupled to the ground plane 18 on the second side 20 of the PCB 16 via a retainer 76 such as solder and/or conductive adhesive.

Figure 9:
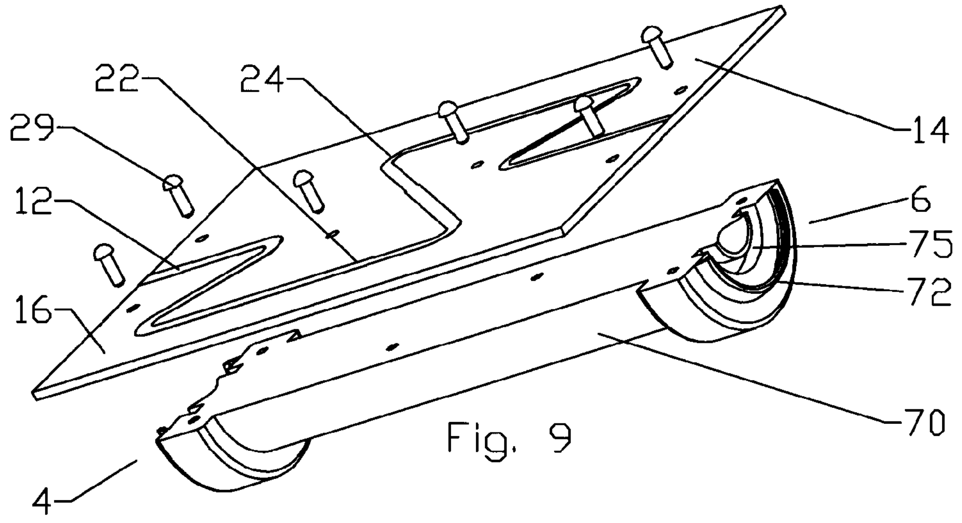
FIG. 9 is an exploded isometric view of a first alternative printed circuit board and ground block configuration.
Figure 10:
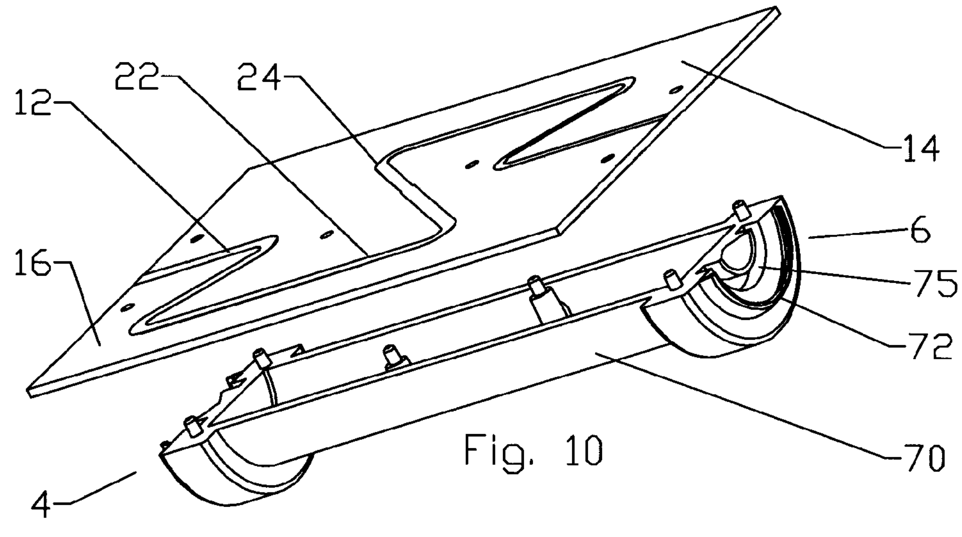
FIG. 10 is an exploded isometric view of a second alternative printed circuit board and ground block configuration.
Figure 11:
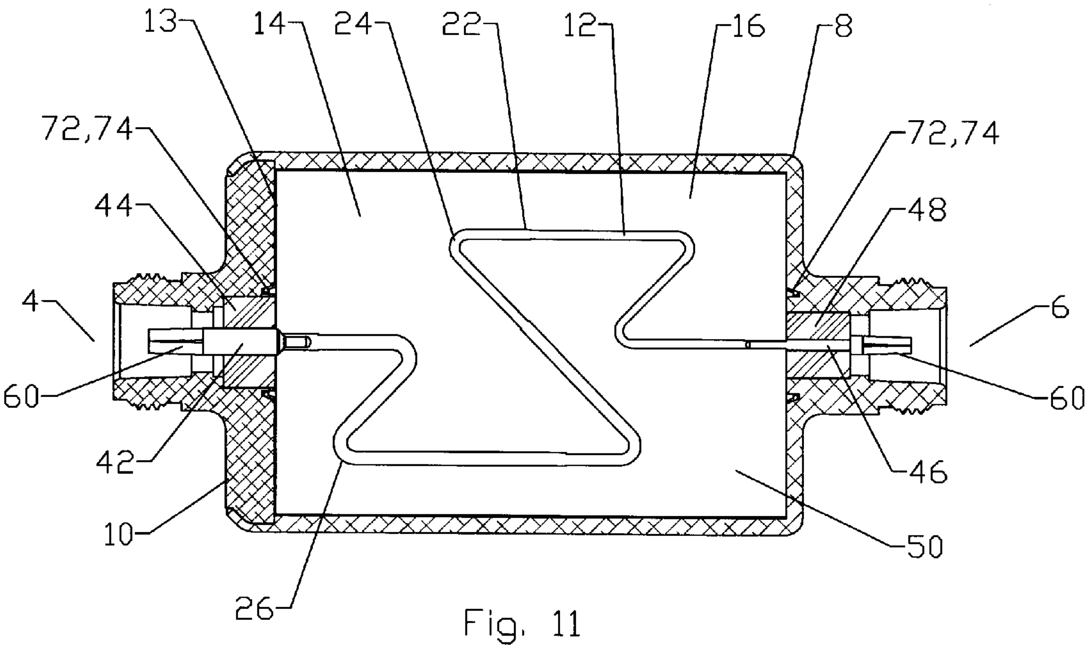
FIG. 11 is a schematic cross sectional side view of a third exemplary embodiment of a Coaxial Impedance Matching Device.

Alternatively, as shown in FIGS. 9 and 10, the ground block 70 may be dimensioned with a narrowed midsection and/or coupled with the assistance of fastener(s) 29 or orientation posts of the ground block 70 projecting through corresponding apertures of the PCB 16. Also as demonstrated in FIG. 10, the ground block 70 may be provided with a cavity to further reduce materials cost and/or weight. One skilled in the art will appreciate that, due to the presence of the cylinder half section structure of the ground block 70, the projecting rim 72 may be formed with a flexure characteristic without overhanging edges along a mold break line, enabling cost effective manufacture by die casting, metal injection molding or the like.

Further stabilization and/or support of the PCB 16 and ground block 70 may be provided by an annular protrusion 73 of the first end 4 of the second insulator 48 and the second end 6 of the first insulator 44 that keys with a corresponding annular groove 74 of the first and second ends 4,6 of the ground block 70 and/or the PCB 16, as shown for example in FIGS. 6 and 7. In embodiments where the first and second contacts 42,46 are not required to resist high longitudinal and/or torsional forces, the insulator keylock arrangement may be simplified, for example as demonstrated in FIG. 11, where both ends of the CIMA 2 are configured as coaxial connector interfaces.

Figure 12:
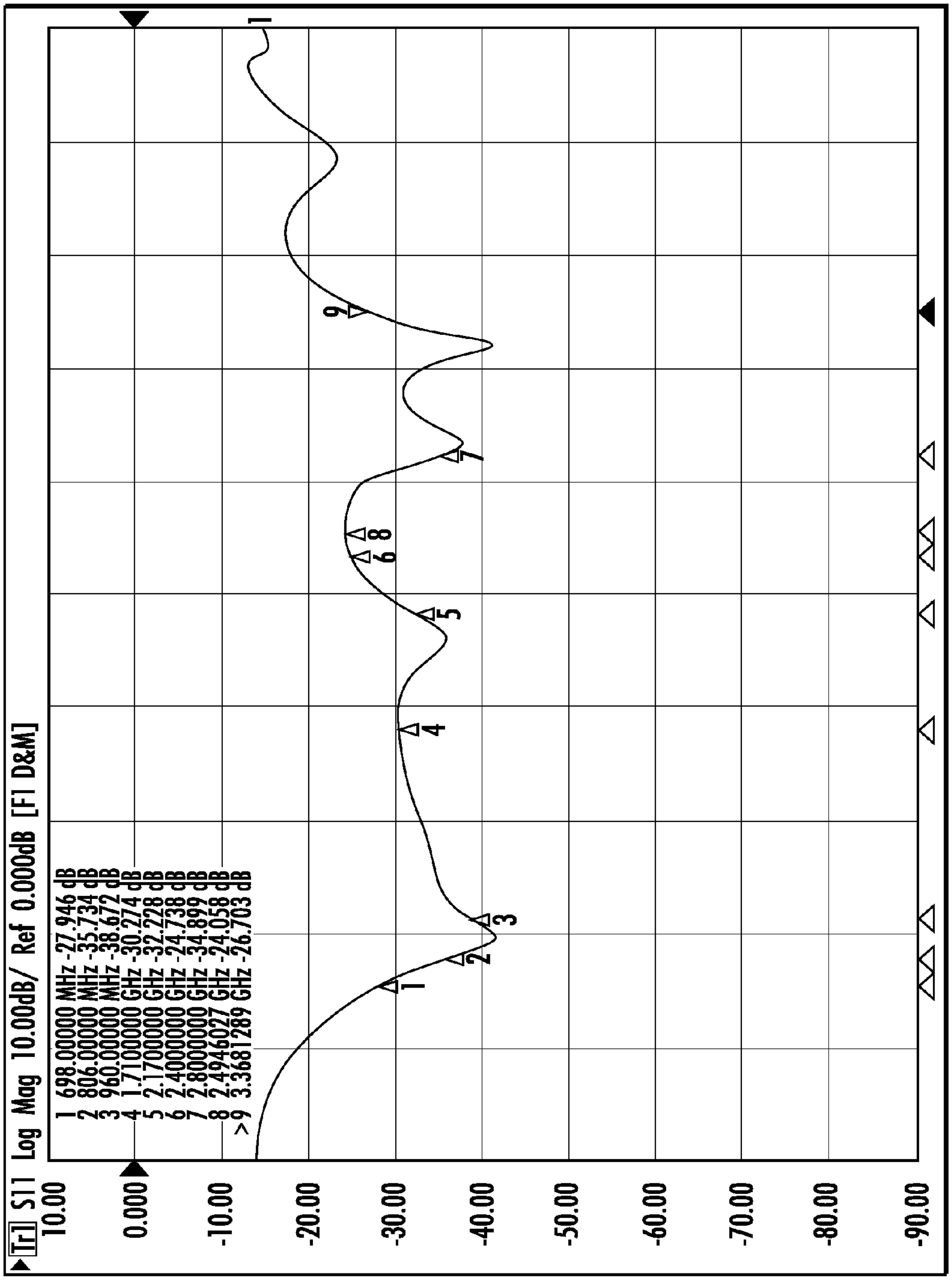
FIG. 12 is a network analyzer plot of a printed circuit board microstrip assembly from the Coaxial Impedance Matching Device of FIG. 5, wherein measurements were taken with the printed circuit board separate from the enclosure.

As shown in FIG. 12, a plot of the PCB 16 of FIGS. 8-10 has been bench tested with a network analyzer separate from the enclosing metal housing, demonstrating viability of the trace 12 configuration for use over a target bandwidth of between at least 698 MHz and 3 Ghz.

In further alternative embodiments, one skilled in the art will appreciate that the CIMA 2 may similarly be configured with a multi-layer and/or multiple printed circuit board(s) 16, for example in a strip line, rather than microstrip configuration.

One skilled in the art will also appreciate that the CIMA 2 may provide an improvement in the signal characteristics, materials and manufacturing costs of an in-line impedance matching device to a level that enables previously impractical substitution of lower cost higher characteristic impedance transmission line and components into multi-band microwave communications systems. Although an in-line connector terminated coaxial body embodiment has been described in detail, one skilled in the art will appreciate that any manner of enclosure may also be applied, including incorporating the PCB 16 into enclosures, for example, formed in non-coaxial configurations such as rectangular cast metal or polymeric enclosures provided with connection interfaces on desired or common sides. Further, the sub-assembly may be incorporated with further equipment and or circuits into existing enclosures with appropriate stand offs applied to isolate the PCB 16 from nearby electrical fields and or shorting surfaces.

Table of Parts

| | |
|---|---|
| 2 | Coaxial Impedance Matching Device |
| 4 | first end |
| 6 | second end |
| 7 | cavity |
| 8 | body portion |
| 10 | cap portion |
| 12 | trace |
| 13 | cavity sidewall |
| 14 | first side |
| 16 | printed circuit board |
| 18 | ground plane |
| 20 | second side |
| 22 | step |
| 24 | bend |
| 26 | outer side |
| 28 | first diameter |
| 29 | fastener |
| 30 | second diameter |
| 31 | inner conductor |
| 32 | ground contact |
| 33 | coaxial cable transmission line |
| 34 | spring finger |

-continued

| Table of Parts | |
|---|---|
| 36 | support block |
| 38 | tension bar |
| 40 | tension screw |
| 41 | fastener screw |
| 42 | first contact |
| 44 | first end insulator |
| 46 | second contact |
| 48 | second end insulator |
| 49 | outward projecting shoulder |
| 50 | inner conductor bore |
| 52 | dielectric key |
| 54 | retaining groove |
| 56 | dielectric retainer |
| 58 | shoulder |
| 60 | spring basket |
| 62 | compression member |
| 64 | compression member groove |
| 66 | wedge surface |
| 68 | ramp surface |
| 70 | ground block |
| 72 | projecting rim |
| 73 | annular protrusion |
| 74 | ground groove |
| 75 | annular groove |
| 76 | retainer |

Where in the foregoing description reference has been made to ratios, integers, components or modules having known equivalents then such equivalents are herein incorporated as if individually set forth.

While the present invention has been illustrated by the description of the embodiments thereof, and while the embodiments have been described in considerable detail, it is not the intention of the applicant to restrict or in any way limit the scope of the appended claims to such detail. Additional advantages and modifications will readily appear to those skilled in the art. Therefore, the invention in its broader aspects is not limited to the specific details, representative apparatus, methods, and illustrative examples shown and described. Accordingly, departures may be made from such details without departure from the spirit or scope of applicant's general inventive concept. Further, it is to be appreciated that improvements and/or modifications may be made thereto without departing from the scope or spirit of the present invention as defined by the following claims.

The invention claimed is:

1. A coaxial impedance matching adapter, comprising:

a body portion with a cavity;

a cap portion; the cap portion configured to mate with the body portion to close the cavity;

an inner conductor bore formed in each of the cap portion and the body portion;

a printed circuit board seated within the cavity; the printed circuit board provided with a trace on a first side and a ground plane on a second side; the trace coupled to a first contact at a first end of the printed circuit board and a second contact at a second end of the printed circuit board; the trace having a sinuous path between the first contact and the second contact, the path longer than a longitudinal axis length of the printed circuit board;

a width of the trace narrowing between the first end of the printed circuit board and the second end of the printed circuit board;

the first contact supported coaxial within the inner conductor bore of the cap portion by a first end insulator;

the second contact supported coaxial within the inner conductor bore of the body portion by a second end insulator; and the ground plane coupled to the body portion and the cap portion.

2. The adapter of claim 1, wherein the ground plane is spaced away from a periphery of the printed circuit board.

3. The adapter of claim 1, wherein a first side of the cap portion has a coaxial connector interface and a second side of the body portion has a coaxial cable connection interface.

4. The adapter of claim 1, wherein a first side of the cap portion and a second side of the body portion each have a coaxial connector interface.

5. The adapter of claim 1, wherein the sinuous path of the trace extends back upon itself, with respect to and across a longitudinal axis.

6. The adapter of claim 1, wherein the ground plane is coupled to the body portion via a ground contact proximate the second end of the printed circuit board and to the cap portion via a ground contact proximate the first end of the printed circuit board.

7. The adapter of claim 6, further including a support block supporting a tension bar contacting each of the ground contacts.

8. The adapter of claim 1, further including an outward projecting shoulder proximate a first end of the second insulator and a retaining groove provided in the outer diameter of the second insulator proximate a second end of the second insulator;

at least two dielectric keys seated in the retaining groove; and a dielectric retainer seated around an outer diameter of the dielectric keys;

the dielectric keys and the outward projecting shoulder longitudinally locking the second insulator upon the body portion.

9. The adapter of claim 8, wherein the dielectric retainer extends over a spring basket of a second end of the second contact.

10. The adapter of claim 1, wherein the width of the trace is narrowed by a plurality of steps.

11. The adapter of claim 10, wherein the steps are spaced substantially one quarter wavelength of an operating frequency apart.

12. The adapter of claim 10, wherein each of the steps are located in a linear portion of the trace.

13. The adapter of claim 1, further including a ground block coupled to the ground plane, the ground block provided with a projecting rim at a first end of the ground block and a second end of the ground block; the projecting rim of the first end of the ground block coupling with a ground groove of the cap portion and the projecting rim of the second end coupling with a ground groove of the body portion.

14. The adapter of claim 13, further including an insulator groove provided in the first and second ends of the ground block; an insulator fin projecting from a second end of the first insulator seated in the insulator groove of the first end of the ground block and an insulator fin projecting from a first end of the second insulator seated in the insulator groove of the second end of the ground block.

15. The adapter of claim 13, wherein the projecting rim of at least one of the first end and the second end of the ground block has a flexure characteristic that biases the projecting rim against the ground groove.

16. The adapter of claim 13, wherein the ground grooves are coaxial with the inner conductor bore.

17. The adapter of claim 13, wherein the ground block is coupled to the ground plane by soldering.

18. The adapter of claim 13, wherein the ground block is coupled to the ground plane by a conductive adhesive.

19. A coaxial impedance matching adapter, comprising:

a body portion with a cavity;

a cap portion; the cap portion configured to mate with the body portion to close the cavity;

an inner conductor bore formed in each of the cap portion and the body portion;

a printed circuit board seated within the cavity; the printed circuit board provided with a trace on a first side and a ground plane on a second side; the trace coupled to a first contact at a first end of the printed circuit board and a second contact at a second end of the printed circuit board; the trace having a plurality of bends routing the trace across a longitudinal axis between the first contact and the second contact, the path longer than a longitudinal axis length of the printed circuit board;

a width of the trace narrowing between the first end of the printed circuit board and the second end of the printed circuit board;

the first contact supported coaxial within the inner conductor bore of the cap portion by a first end insulator;

the second contact supported coaxial within the inner conductor bore of the body portion by a second end insulator; and the ground plane coupled to the body portion and the cap portion.

20. A coaxial impedance matching adapter, comprising:

a body portion with a cavity;

a cap portion; the cap portion configured to mate with the body portion to close the cavity;

an inner conductor bore formed in each of the cap portion and the body portion;

a printed circuit board seated within the cavity; the printed circuit board provided with a trace on a first side and a ground plane on a second side; the trace coupled to a first contact at a first end of the printed circuit board and a second contact at a second end of the printed circuit board; the trace having a sinuous path between the first contact and the second contact, the path longer than a longitudinal axis length of the printed circuit board;

a width of the trace narrowing between the first end of the printed circuit board and the second end of the printed circuit board;

the first contact supported coaxial within the inner conductor bore of the cap portion by a first end insulator;

the second contact supported coaxial within the inner conductor bore of the body portion by a second end insulator;

the ground plane coupled to the body portion and the cap portion;

a ground block coupled to the ground plane, the ground block provided with a projecting rim at a first end of the ground block and a second end of the ground block; the projecting rim of the first end of the ground block coupling with an annular ground groove of the cap portion and the projecting rim of the second end coupling with a ground groove of the body portion;

an insulator groove provided in the first and second ends of the ground block; an insulator fin projecting from a second end of the first insulator seated in the insulator groove of the first end of the ground block and an insulator fin projecting from a first end of the second insulator seated in the insulator groove of the second end of the ground block;

the projecting rim of at least one of the first end and the second end of the ground block provided with a flexure characteristic that biases the projecting rim against the ground groove.

21. A method for manufacturing a coaxial impedance matching adapter, comprising the steps of:

coupling a first contact to a trace at a first end of a printed circuit board and a second contact to the trace at a second end of the printed circuit board; the trace having a sinuous path along a first side of the printed circuit board, the path longer than a longitudinal axis length of the printed circuit board;

inserting the printed circuit board within a cavity of a body portion, the second contact supported by a second insulator within an inner conductor bore of the body portion;

closing the cavity by coupling a cap portion to the body portion, the first contact supported by a first insulator within an inner conductor bore of the cap portion;

the coupling of the cap portion to the bottom portion coupling a ground plane on a second side of the printed circuit board to the body portion and the cap portion.

* * * * *